United States Patent
Fong et al.

(10) Patent No.: US 9,748,993 B2
(45) Date of Patent: Aug. 29, 2017

(54) RADIO FREQUENCY RECEIVER FRONT-END WITH GAIN CONTROL CAPABILITY AS WELL AS IMPROVED IMPEDANCE MATCHING CONTROL CAPABILITY

(71) Applicant: MEDIATEK INC., Hsin-Chu (TW)

(72) Inventors: Neric Fong, Portola Valley, CA (US); Keng Leong Fong, Sunnyvale, CA (US); Dai Sieh, Palo Alto, CA (US); Bryan Liangchin Huang, Los Altos, CA (US)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/256,730

(22) Filed: Sep. 5, 2016

(65) Prior Publication Data

US 2017/0070252 A1    Mar. 9, 2017

Related U.S. Application Data

(60) Provisional application No. 62/215,284, filed on Sep. 8, 2015.

(51) Int. Cl.
| | |
|---|---|
| *H04B 17/02* | (2006.01) |
| *H04B 1/16* | (2006.01) |
| *H03F 3/19* | (2006.01) |
| *H03G 3/30* | (2006.01) |

(Continued)

(52) U.S. Cl.
CPC ......... *H04B 1/1638* (2013.01); *H03D 7/1491* (2013.01); *H03F 3/19* (2013.01); *H03G 3/3036* (2013.01); *H03G 3/3052* (2013.01); *H04B 1/40* (2013.01); *H03F 2200/222* (2013.01); *H03F 2200/294* (2013.01); *H03F 2200/451* (2013.01)

(58) Field of Classification Search
CPC ...... H04B 1/1638; H04B 1/40; H03D 7/1491; H03F 2200/294
USPC ...... 455/239.1, 136, 138, 219, 232.1, 240.1, 455/245.1, 251.1
See application file for complete search history.

(56) References Cited

U.S. PATENT DOCUMENTS 6,639,447 B2 * 10/2003 Manku ................. H03D 7/1441
                                        327/359
7,599,675 B2 * 10/2009 Mu ...................... H03D 7/1441
                                        375/345

(Continued)

FOREIGN PATENT DOCUMENTS

| CN | 101064522 A | 10/2007 |
|---|---|---|
| JP | 200144861 A | 2/2001 |

OTHER PUBLICATIONS

Masuch, A 1.1-mW-RX-81.4-dBm Sensitivity CMOS Transceiver for Bluetooth Low Energy, Apr. 2013, 1660-1673, vol. 61, No. 4, IEEE, Spain, Apr. 1, 2013.

(Continued)

*Primary Examiner* — Sonny Trinh
(74) *Attorney, Agent, or Firm* — Winston Hsu

(57) ABSTRACT

A radio frequency receiver is provided. The receiver can be employed in a low power (or ultra-low power) receiver architecture to generate a baseband signal or an intermediate frequency signal. In addition, the receiver includes capabilities of gain control to provide different gain settings as well as providing better/improved impedance matching control.

20 Claims, 9 Drawing Sheets

(51) Int. Cl.
*H03D 7/14* (2006.01)
*H04B 1/40* (2015.01)

(56) References Cited

U.S. PATENT DOCUMENTS

| | | | |
|---|---|---|---|
| 8,351,978 B2* | 1/2013 | Tasic | H03G 3/3052 |
| | | | 455/234.1 |
| 8,433,272 B2* | 4/2013 | Gudem | H04B 1/109 |
| | | | 455/234.1 |
| 2009/0239592 A1 | 9/2009 | Deng | |
| 2010/0144305 A1 | 6/2010 | Cook | |
| 2014/0170999 A1 | 6/2014 | Aparin | |

OTHER PUBLICATIONS

Ben W. Cook, Low-Power 2.4-GHz Transceiver With Passive RX Front-End and 400-mV Supply, Dec. 2006, 2757-2766, vol. 41, No. 12, IEEE, USA, Dec. 1, 2006.

Jonathan Borremans et al., A 40 nm CMOS 0.4-6 GHz Receiver Resilient to Out-of-Band Blockers, Jul. 1, 2011, 1659-1671, vol. 46, No. 7, IEEE, Belgium.

David Murphy, A Blocker-Tolerant, Noise-Cancelling Receiver Suitable for Wideband Wireless Applications, Dec. 2012, 2943-2963, vol. 47, No. 12, IEEE, USA, Dec. 1, 2012.

Caroline Andrews, A Passive Mixer-First Receiver With Digitally Controlled and Widely Tunable RF Interface, Dec. 2010, 2696-2708, vol. 45, No. 12, IEEE, USA, Dec. 1, 2010.

Kevin Chuang et al., A 90 nm CMOS Broadband Multi-Mode Mixed-Signal Demodulator for 60 GHz Radios, IEEE Transactions on Microwave Theory and Techniques, vol. 58, No. 12, IEEE, XP011339636, Dec. 2010, pp. 4060-4071.

Charles Wu et al., A Passive-Mixer-First Receiver with LO Leakage Suppression, 2.6dB NF, >15dBm Wide-Band IIP3, 66dB IRR Supporting Non-contiguous Carrier Aggregation, RMO3C-4, 2015 IEEE Radio Frequency Integrated Circuits Symposium, XP032818605, IEEE, May 17, 2015, pp. 155-158.

Charles Wu et al, A Passive-Mixer-First Receiver with LO Leakage Suppression, 2.6dB NF, >15dBm Wide-Band IIP3, 66dB IRR Supporting Non-contiguous Carrier Aggregation, RMO3C-4, 2015 IEEE Radio Frequency Integrated Circuits Symposium, XP032818605, 2015, pp. 155-158, USA.

* cited by examiner

RADIO FREQUENCY RECEIVER FRONT-END WITH GAIN CONTROL CAPABILITY AS WELL AS IMPROVED IMPEDANCE MATCHING CONTROL CAPABILITY

CROSS REFERENCE TO RELATED APPLICATIONS

This application claims priority of U.S. provisional application Ser. No. 62/215,284 filed on Sep. 8, 2015, which is entirely incorporated herein by reference.

BACKGROUND

The invention relates to a receiver scheme, and more particularly to a radio frequency receiver front-end.

Generally speaking, a conventional receiver consists of a low-noise amplifier (LNA) for improving SNR, a mixer for frequency conversion, and a low-pass filter to filter out unwanted signals for channel selection. The linearity of the conventional receiver is usually limited by the LNA and mixer. To achieve high linearity, a conventional scheme may configure the output impedance of LNA to be a low impedance and pair with a passive mixer which has good linearity due to it passive nature. To achieve the low output impedance, the conventional scheme may employ a transimpedance amplifier (TIA) wherein the TIA has a low input impedance at baseband and this low input impedance can be frequency-translated to LNA output at RF frequency through the passive mixer. In addition, to suppress impairment introduced by a passive mixer, the mixer size has to be larger to minimize adding extra mixer switch impedance to the required low impedance path. Unfortunately, the larger mixer size requires larger LO drivers, and hence causes larger power consumption for the LO driver. The LO driver is the major power consumption contributor. In addition, for TIA to generate low impedance at its input, a large current consumption is required to maintain low noise and low impedance across the bandwidth. The TIA is another major power consumption contributor. It is a key issue to reduce larger power consumption from the LO driver and TIA for a ultra-lower power receiver design.

SUMMARY

Therefore one of the objectives of the present invention is to provide a receiver scheme having smaller LO driver(s) and TIA replaced configuration, to solve the above-mentioned problems.

According to embodiments of the present invention, a radio frequency front-end receiver comprises a mixer, a gain control circuit, and an amplifier. The mixer is used for receiving a radio frequency signal and generating an output signal at a baseband frequency, and the output of the mixer is connected to a high impedance circuit. The gain control circuit is coupled between an output of the mixer and an input of the amplifier. The amplifier is coupled to the gain control circuit. The gain control circuit is arranged to detect a signal at the input of the amplifier to adjust a gain value that is exerted on the output signal generated at the output of the mixer to maintain linearity of the amplifier.

According to embodiments of the invention, an RF receiver comprises a voltage step-up circuit, at least one amplifier, at least one first mixer, and at least one second mixer. The voltage step-up circuit is for receiving and providing a voltage gain for a radio frequency signal. The at least one amplifier is coupled to an output of the voltage step-up circuit. The at least one first mixer is coupled to an output of the at least one amplifier and used for generating the low frequency signal in a first gain mode. The at least one second mixer is coupled to the output of the voltage step-up circuit and used for generating the low frequency signal in a gain mode different from the first gain mode. The voltage step-up circuit, the amplifier, and the at least one first mixer are enabled in the first gain mode to generate the low frequency signal; the voltage step-up circuit and the at least one second mixer are enabled in the gain mode different from the first gain mode to generate the low frequency signal.

According to the embodiments, an RF receiver is disclosed. The RF receiver comprises an amplifier, a first mixer, a second mixer, and a switchable impedance unit. The amplifier is used for receiving and providing a voltage gain for a radio frequency input signal. The first mixer is coupled to an output of the amplifier. The second mixer is coupled to the input of the amplifier. The switchable impedance unit is selectively coupled to the second mixer. The amplifier and the first mixer are enabled in the first gain mode to generate the low frequency signal. The second mixer is enabled and the switchable impedance unit is not coupled to the second mixer in a second gain mode to generate the low frequency signal. The second mixer is enabled and the switchable impedance unit is coupled to the second mixer in a third gain mode to generate the low frequency signal. The first gain mode, the second gain mode, and the third gain mode respectively correspond to different gain settings These and other objectives of the present invention will no doubt become obvious to those of ordinary skill in the art after reading the following detailed description of the preferred embodiment that is illustrated in the various figures and drawings.

DETAILED DESCRIPTION

For low-power or ultra-low-power receiver design (s), a passive mixer is preferred as it consumes less current. To reduce the size of passive mixer while keeping a high linearity and impedance matching of the receiver, the passive mixer is preferably to be a switch wherein the switch is with low impedance when enabled and is with high impedance when disabled. To achieve this, a passive mixer is usually to be large in device size to provide low impedance when enabled, and is usually used together with the TIA which has low output impedance. However, the cost of power consumption is high because of the large passive mixer and that the passive mixer is used with the TIA which has low output impedance.

In embodiments of the invention, the objective is to (1) reduce power consumption, (2) make the input impedance and output impedance of passive mixer be configured as high impedances so that the receiver front-end can match with high input impedance of baseband circuits, and (3) maintain the linearity for making linearity performance be better than the linearity performance of the scheme employing the TIA having low output impedance.

Figure 1:
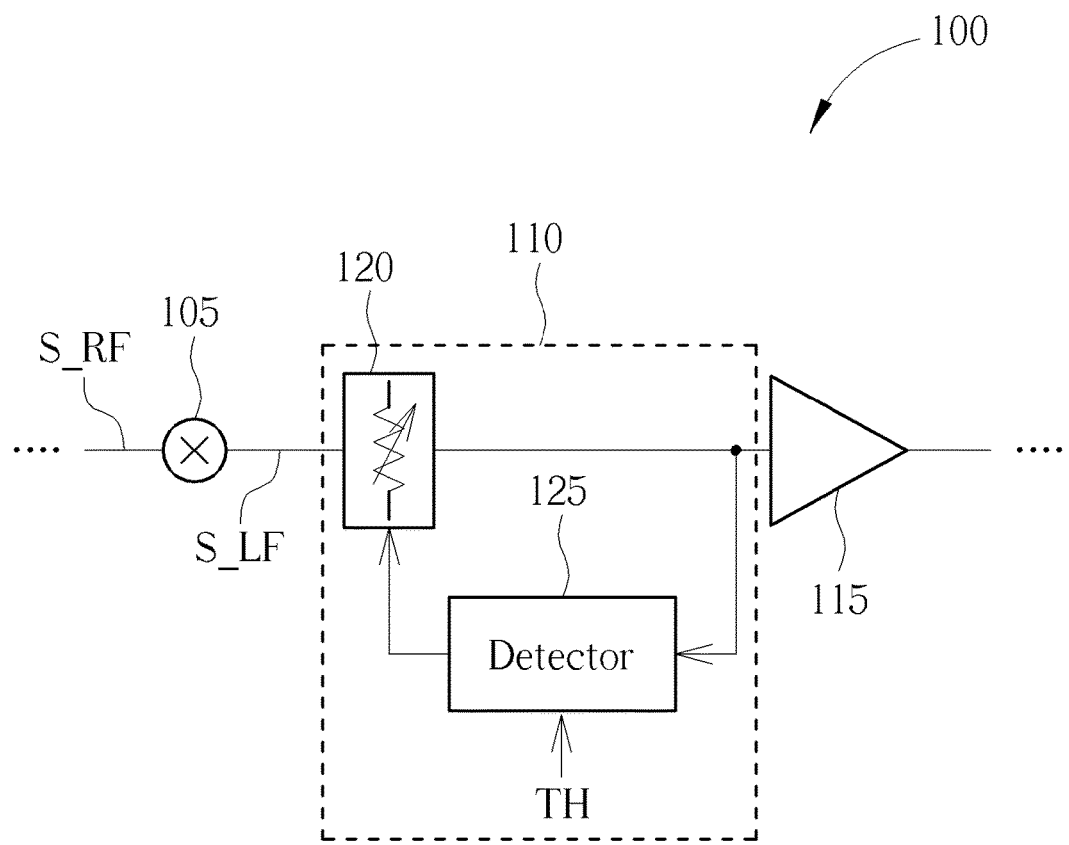
FIG. 1 is a block diagram of a radio frequency receiver front-end according to a first embodiment of the invention.

Please refer to FIG. 1, which is a block diagram of a radio frequency (RF) receiver front-end 100 according to a first embodiment of the invention. The receiver front-end 100 is able to fulfill the requirements of low power, high linearity, low noise, and good impedance matching, and can be employed in a low power (or ultra-low power) receiver architecture. The receiver front-end 100 can be applied to products based on the Internet of Things (IoT) technology. In addition, the receiver front-end 100 includes capabilities of gain control to provide different gain settings as well as impedance matching control. Specifically, the receiver front-end 100 is capable of matching with high input impedance of baseband circuits (or intermediate-frequency circuits) by using a mixer-first topology and is also capable of maintaining the high linearity of an amplifier in the open loop by the gain control capability so that no transimpedance amplifiers (TIA) are needed. In this embodiment, the receiver front-end 100 comprises a mixer 105 such as a passive mixer, a gain control circuit 110, and an amplifier 115. The passive mixer 105 such as a voltage mode mixer or a current mode mixer is configured for converting the high or radio frequency input signal S_RF to generate the low frequency signal S_LF. The low frequency signal S_LF can be a baseband signal or an intermediate frequency signal. The gain control circuit 110 is coupled between an output of passive mixer 105 and an input of amplifier 115. The gain control circuit 110 is arranged to detect a signal at the input of amplifier 115 to adjust a gain value that is exerted on the low frequency signal S_LF generated at the output of passive mixer 105. In this embodiment, the gain control circuit 110 comprises an attenuation circuit 120 and a detector 125. The attenuation circuit 120 is coupled between the output of passive mixer 105 and the input of amplifier 115. The detector 125 is coupled to the attenuation circuit 120 and the input of amplifier 115, and is used for sensing a level of the signal at the input of amplifier 115 to control the attenuation circuit 120 to adjust/control the gain level to perform gain attenuation for a level of the low frequency signal S_LF. The detector 125 is arranged to compare the level of the signal at the input of amplifier 115 with a threshold condition TH to determine whether to adjust the gain value. The attenuation circuit 120 is arranged to provide multiple different gain settings. Accordingly, after the process of gain control/adjusting has been completed, the voltage swing at the input of amplifier 115 does not exceed the threshold condition TH, which ensures that the linearity of amplifier 115 will not be degraded. Note that the attenuation circuit 120 is also passive for linearity consideration, and the detector 125 is a low-power fast detector as opposed to AGC with ADC which has long settling time.

By the architecture (mixer-first topology) of the receiver front-end 100, the input impedance and output impedance of passive mixer 105 can be configured as high impedances so that the receiver front-end 100 can match with high input impedance of baseband circuits (or intermediate-frequency circuits). The circuit size of passive mixer 105 for implementation can be decreased to a smaller one. This achieves that even though a higher turned-on resistance Ron of transistors can still be tolerated as long as the output impedance of the passive mixer 105 is greater than the turned-on resistance Ron. In addition, this makes a possibility to configure the gain value of an RF matching circuit as a higher value. Also, the forward transconductance gain can be configured to be a higher value since output thermal noise contribution becomes smaller due to that the receiver front-end 100 moderately matches with the high input impedance of baseband/intermediate-frequency circuits.

Figure 2:
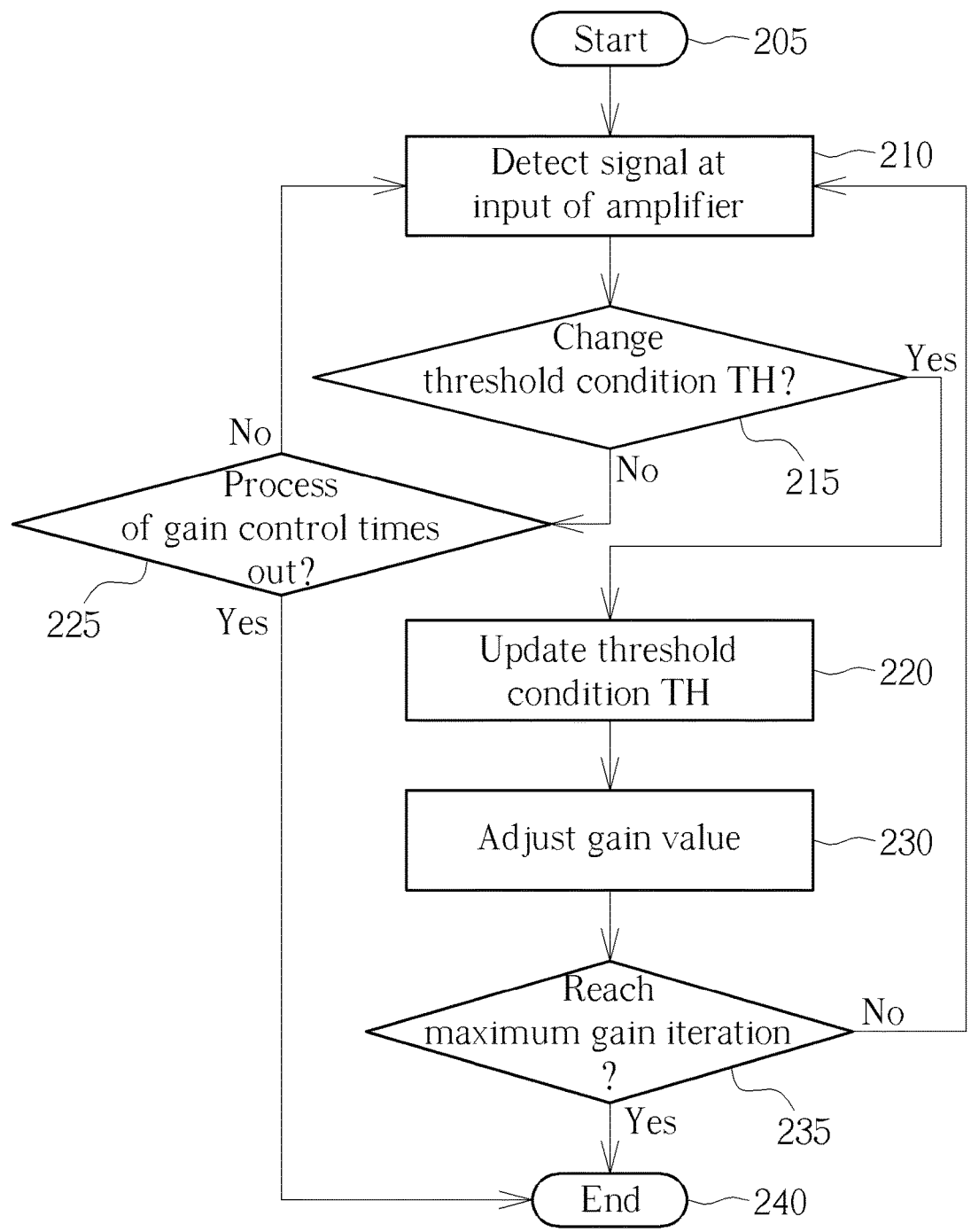
FIG. 2 is a diagram illustrating a flowchart of an example of operation of gain control circuit as shown in FIG. 1.

In addition, the gain control circuit 110 is capable of gradually updating and changing (e.g., increasing, decreasing and remaining) the circuit 110 gain value and the threshold condition TH that is used to be compared with the level of the signal at the input of amplifier 115. The control can be implemented by analog circuit or digital circuit. This improves the accuracy of gain control operation as well as maximizing the gain and noise performance without degrading the linearity of the receiver system. FIG. 2 is a diagram illustrating a flowchart of an example of operation of gain control circuit 110 as shown in FIG. 1. Provided that substantially the same result is achieved, the steps of the flowchart shown in FIG. 2 need not be in the exact order shown and need not be contiguous, that is, other steps can be intermediate. Steps are detailed in the following:

Step 205: Start;
Step 210: Detect a signal at the input of amplifier 115;
Step 215: determine whether to change the level of threshold condition TH or not. If it is determined to change the threshold condition TH, the flow proceeds to Step 220, otherwise, the flow proceeds to Step 225;
Step 220: update the level of threshold condition TH;
Step 225: decide if the process of gain control times out or not. If the gain control process times out, the flow proceeds to Step 240, otherwise, the flow proceeds to Step 210;
Step 230: adjust the gain value that is exerted on the low frequency signal S_LF generated at the output of the passive mixer 105;
Step 235: determine if the gain control process reaches the maximum gain iteration or not. If the gain control process reaches the maximum iteration, the flow proceeds to Step 240, otherwise, the flow proceeds to Step 210;
Step 240: End.

Figure 3:
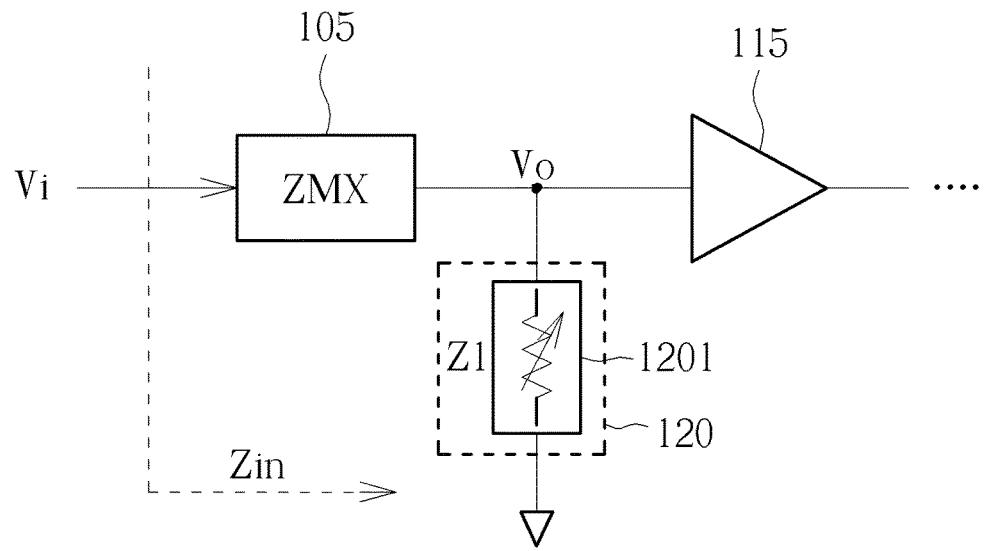
FIG. 3 is diagram illustrating an embodiment of the attenuation circuit as shown in FIG. 1.

Further, in practice, the attenuation circuit 120 for example equivalently comprises a programmable impedance element. FIG. 3 is diagram illustrating an embodiment of the attenuation circuit 120 shown in FIG. 1. The attenuation circuit 120 comprises a programmable impedance element 1201 including impedance value Z1 that is programmable. The programmable impedance element 1201 has one end connected between passive mixer 105 and amplifier 115 and has the other end connected to a ground level. The impedance of passive mixer 105 is equal to ZMX, and the input impedance Zin of receiver front-end 100 depends on the impedance value Z1 and is equal to the sum of ZMX and Z1.

The gain value G of passive mixer 105 after adjusted by the gain control circuit 110 is determined by the following equation:

$$G = \frac{Vo}{Vi} = \frac{Z1}{ZMX + Z1}.$$

Figure 4:
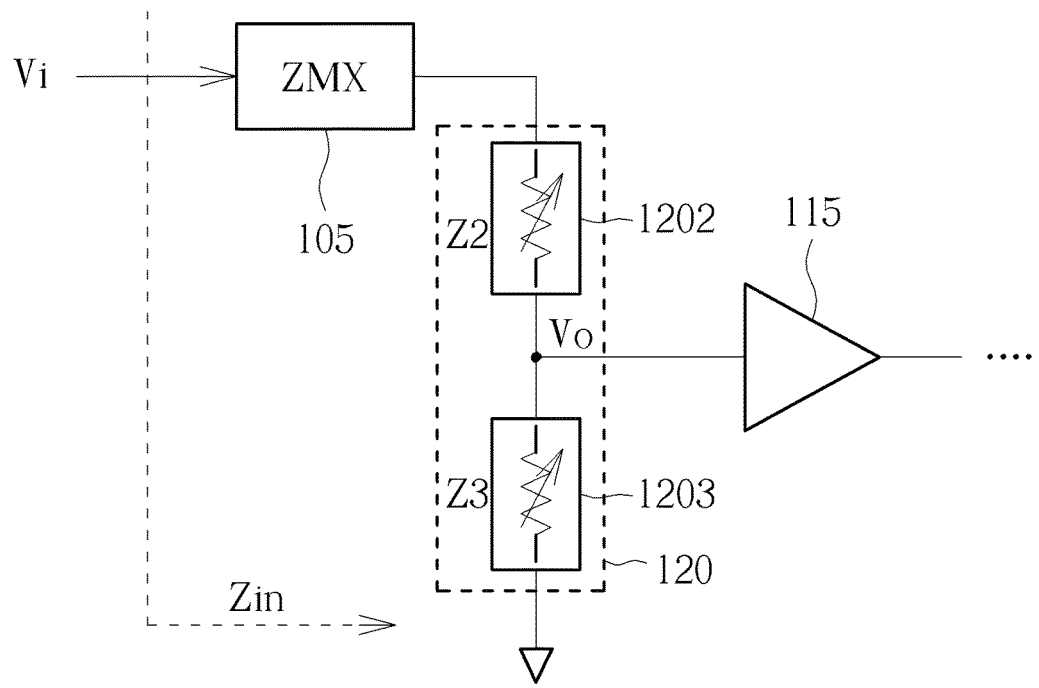
FIG. 4 is diagram illustrating another embodiment of the attenuation circuit as shown in FIG. 1.

In addition, in other embodiments, the attenuation circuit 120 for example comprises multiple programmable impedance elements. FIG. 4 is diagram illustrating another embodiment of the attenuation circuit 120 shown in FIG. 1. In FIG. 4, the attenuation circuit 120 comprises a first programmable impedance element 1202 and a second programmable impedance element 1203 that are connected in series. The programmable impedance elements 1202 and 1203 include programmable impedance value Z2 and Z3, respectively. The programmable impedance element 1202 has one end connected to the output of passive mixer 105 and has the other end connected to the input of amplifier 115, and the programmable impedance element 1203 has one end connected to the input of amplifier 115 and has the other end connected to the ground level. The impedance of passive mixer 105 is equal to ZMX, and the input impedance Zin of receiver front-end 100 depends on the impedance value Z2+Z3 and is equal to the sum of ZMX, Z2, and Z3. The gain value G of passive mixer 105 after adjusted by the gain control circuit 110 is determined by the following equation:

$$G = \frac{Vo}{Vi} = \frac{Z3}{ZMX + Z2 + Z3}.$$

In this example, the sum of impedance values Z2 and Z3 can be configured as a constant and fixed value. For example, the impedance value Z2 is configured as A×Z0 and the impedance value Z3 is configured as (1−A)×Z0 wherein the parameter A is between zero and one and Z0 means a constant value. In this way, the input impedance Zin of receiver front-end 100 can remain constant while multiple different gain settings are provided.

Figure 5:
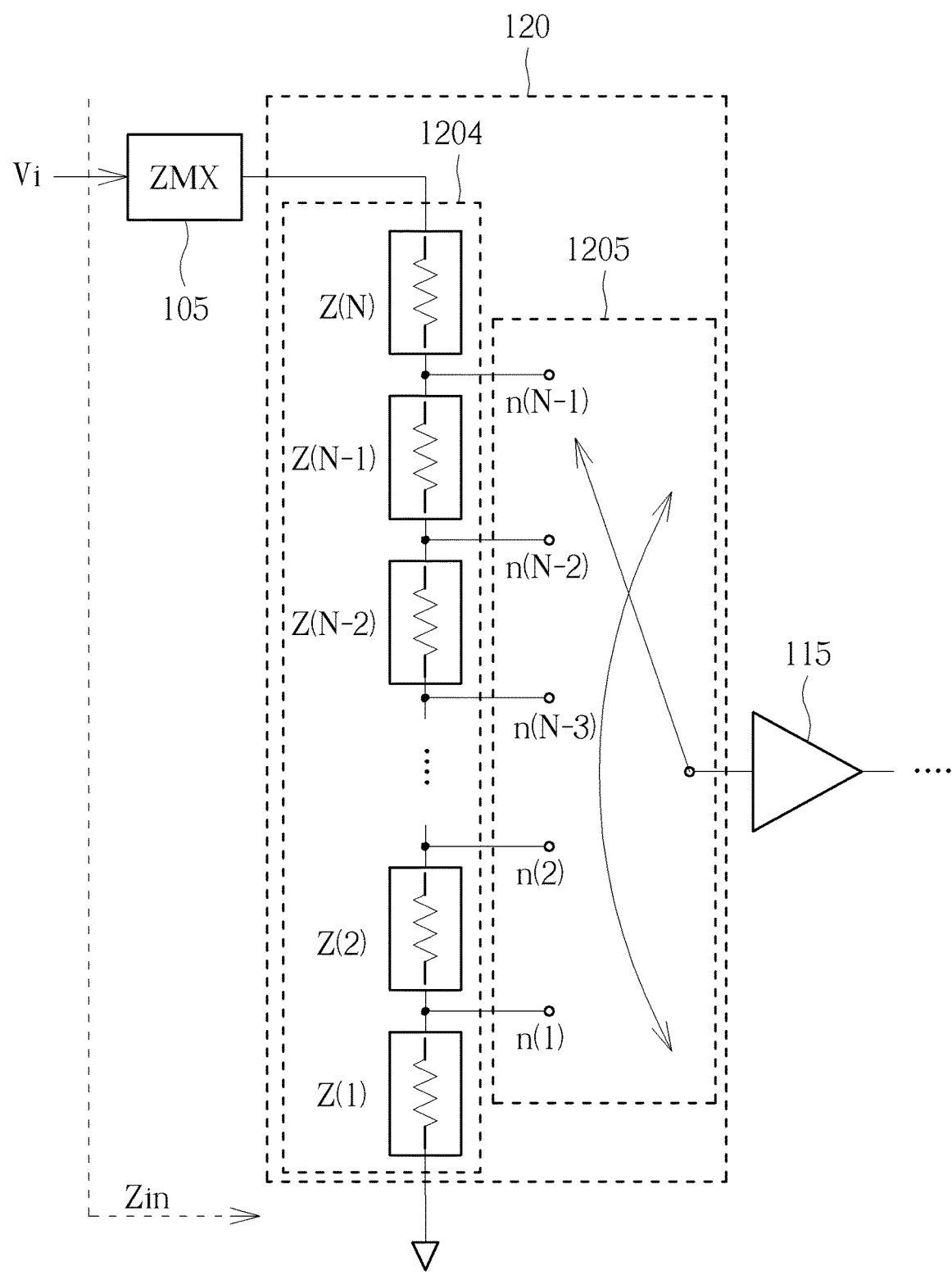
FIG. 5 is a diagram illustrating an example of programmable impedance ladder of the attenuation circuit as shown in FIG. 1.

FIG. 5 is a diagram illustrating an example of programmable impedance ladder of the attenuation circuit 120 as shown in FIG. 1. In FIG. 5, the attenuation circuit 120 comprises a programmable impedance ladder 1204 including more impedance elements connected in series and a multiplexer switch 1205. The multiplexer switch 1205 is arranged to select one gain setting among multiple different gain settings by selectively connecting the input of amplifier 115 to one node among the intermediate nodes (from n(1) to n(N−1)) based on the detection/control of detector 125 of FIG. 1. The impedance of passive mixer 105 is equal to ZMX, and the input impedance Zin of receiver front-end 100 is defined by the following equation:

$$Zin = ZMX + \Sigma_{k=1}^{N} Z(k).$$

N means the total number of impedance elements in the programmable impedance ladder 1204, and Z(k) means the impedance value of k-th impedance element. The gain value G of passive mixer 105 after adjusted by the gain control circuit 110 can be defined by the following equation:

$$G = \frac{Vo}{Vi} = \frac{\sum_{k=1}^{s} Z(k)}{ZMX + \sum_{k=1}^{N} Z(k)}.$$

Vo means the voltage at input of the amplifier 115 (that is, the output voltage of passive mixer 105 after processed by the gain control circuit 120), Vi means input voltage of passive mixer 105, parameters means that the multiplexer switch 1205 connects the input of amplifier 115 to the node between the s-th impedance element and the (s+1)-th impedance element. Although the impedance elements are fixed values in FIG. 5, it is not meant to be a limitation; in other embodiments, the impedance elements may have programmable impedance values, and similarly, the sum of impedance values of the total number of programmable impedance elements can be also configured as a constant and fixed value such that the input impedance Zin of receiver front-end 100 can remain constant while multiple different gain settings are provided.

Figure 6:
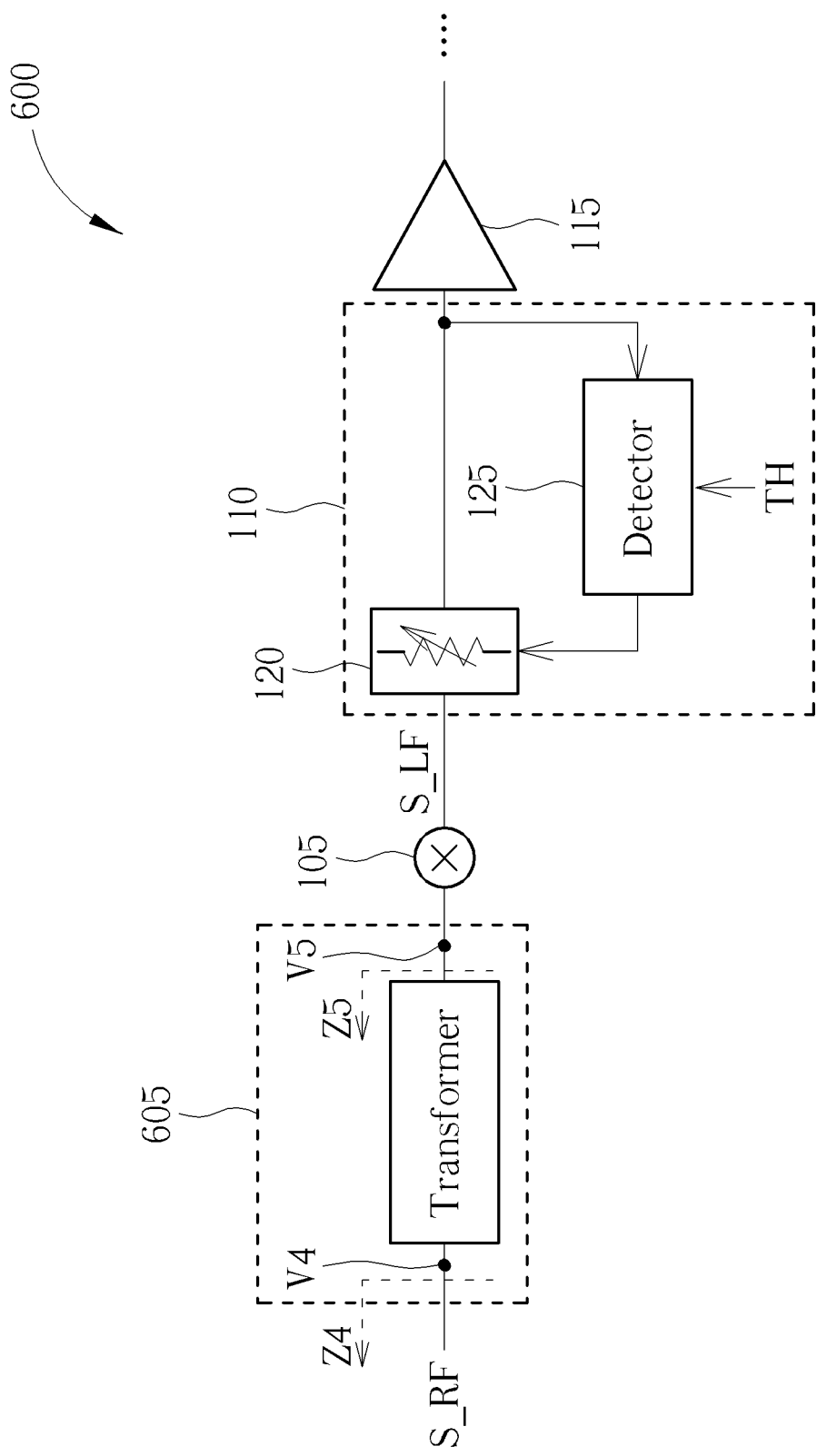
FIG. 6 is block diagram illustrating a radio frequency receiver front-end according to a second embodiment of the invention.
Figure 7:
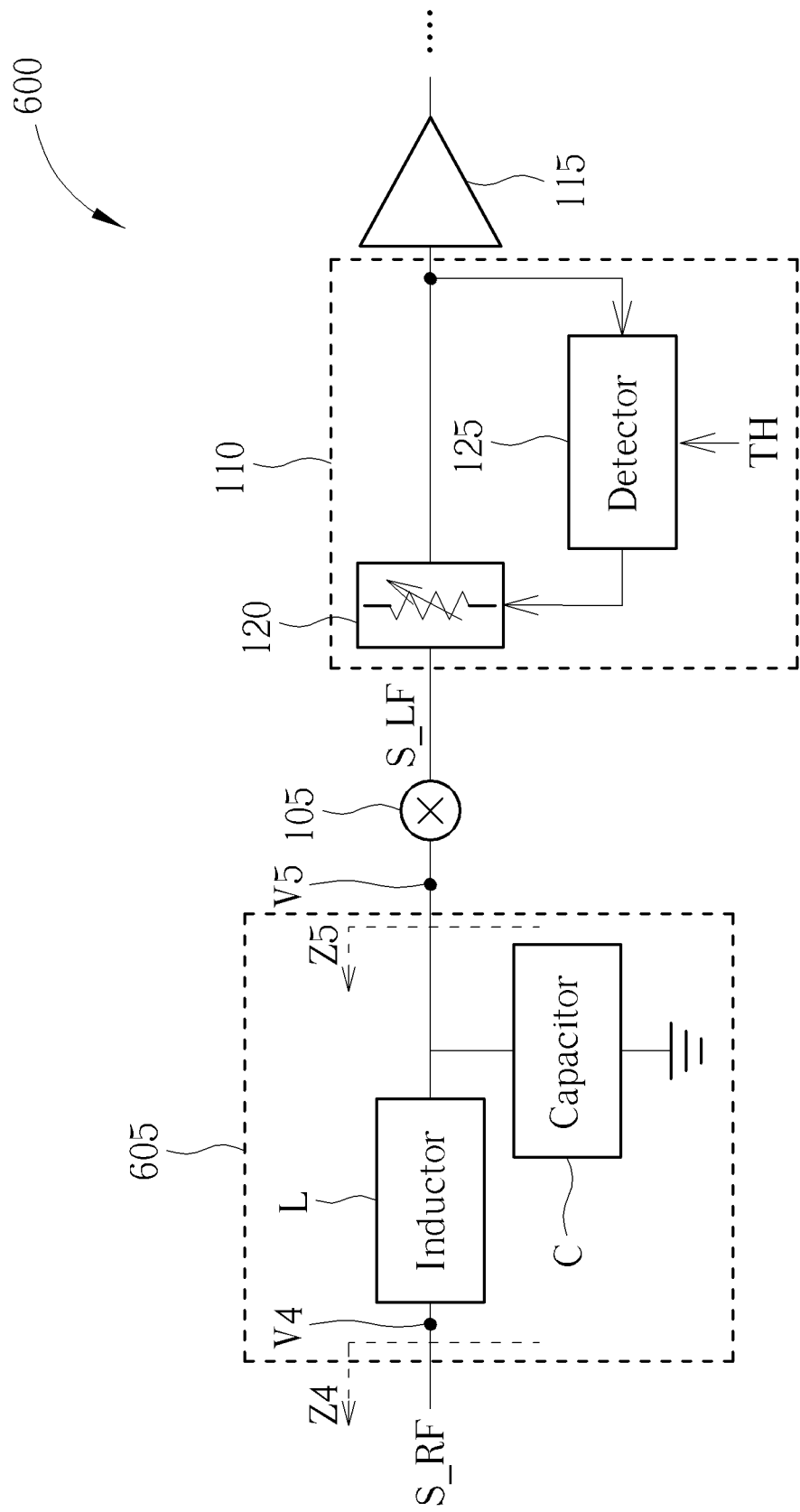
FIG. 7 is block diagram illustrating another variation embodiment of a radio frequency receiver front-end according to the second embodiment shown in FIG. 6.

In addition, a voltage step-up circuit can be included within the above receiver. FIG. 6 is block diagram illustrating a radio frequency (RF) receiver front-end 600 according to a second embodiment of the invention. The RF receiver front-end 600 comprises a voltage step-up circuit 605, passive mixer 105, gain control circuit 110, and amplifier 115. The operations and functions of passive mixer 105, gain control circuit 110, and amplifier 115 are identical to those circuit elements including the same reference numerals in FIG. 1 and are not detailed for brevity. The voltage step-up circuit 605 comprising a transformer is used for receiving the high or radio frequency input signal S_RF to provide a voltage gain V5/V4 (that is equal to $$\sqrt{\frac{Z5}{Z4}})$$

for the signal S_RF wherein Z5 means impedance seen from voltage V5 to voltage step-up circuit 605 while Z4 means input impedance seen from voltage V4. The voltage step-up circuit 605 is positioned preceding the passive mixer 105. The voltage gain is also referred as a step-up ratio. Additionally, in other embodiments, as shown in FIG. 7, the voltage step-up circuit 605 can be implemented by including an inductor L and a capacitor C without using a transformer. The combination of inductor L and capacitor C can be also used for providing the voltage gain V5/V4 (that is equal to $$\sqrt{\frac{Z5}{Z4}})$$

for the signal S_RF. By adding the voltage step-up circuit 605 at RF input node of the receiver front-end 600 (i.e., preceding the passive mixer 105 in the mixer-first-and-high-baseband-input-impedance receiver topology), a passive voltage gain can be additionally obtained with low power consumption.

Figure 8:
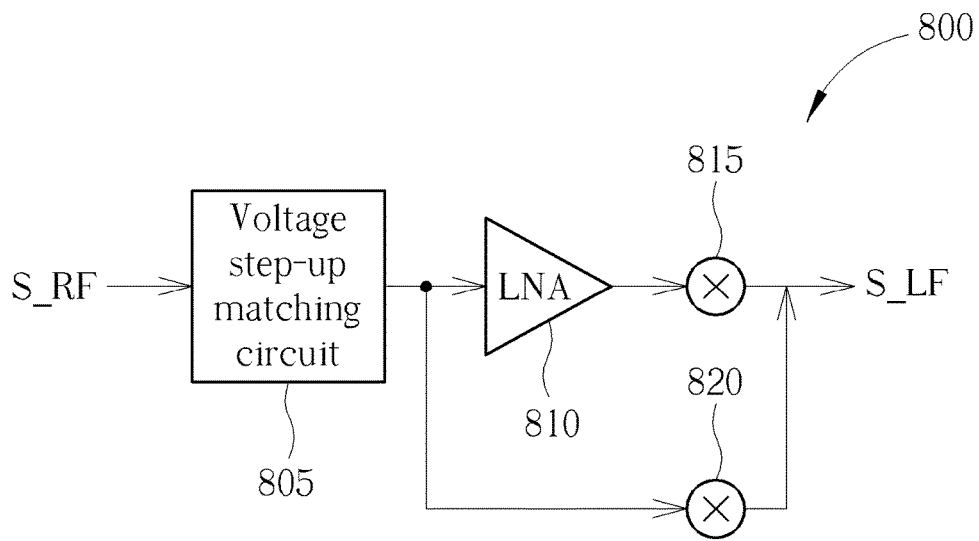
FIG. 8 is a block diagram of a radio frequency receiver front-end according to a third embodiment of the invention.

FIG. 8 is a block diagram of an RF receiver front-end 800 according to a third embodiment of the invention. The RF receiver front-end 800 is capable of supporting multiple gain modes to provide gain control for a high or radio frequency input signal S_RF to generate a low frequency signal S_LF as well as providing better impedance matching capability with baseband circuit(s) or intermediate frequency circuit(s). Also, the receiver front-end 800 has lower input return loss and better/improved noise figure. Low frequency signal S_LF can be a baseband signal or intermediate frequency signal. In this embodiment, the receiver front-end 800 comprises a voltage step-up circuit 805, at least one amplifier 810 such as an LNA, at least one first mixer 815, and at least one second mixer 820. The voltage step-up circuit 805 is used for receiving a high or radio frequency input signal S_RF and providing a voltage gain (i.e. step-up ratio) for the input signal S_RF. The voltage step-up circuit 805 can be implemented by using a transformer as shown in FIG. 6 or a combination of an inductor and a capacitor as shown in FIG. 7. This is not meant to be a limitation of the invention. The LNA 810 is coupled to the output of voltage step-up circuit 805 and to amplify the high or radio frequency input signal S_RF as well as reducing noise. The first mixer 815 is coupled to the output of LNA 810 and is used for generating the low frequency signal S_LF in a first gain mode. The second mixer 820 is coupled to the output of voltage step-up circuit 805 and is used for generating the low frequency signal S_LF in a gain mode (e.g. second gain mode) different from the first gain mode. The voltage step-up circuit 805, LNA 810, and first mixer 815 are enabled in the first gain mode and configured to provide a first gain setting for the input signal S_RF to generate the low frequency signal S_LF. In the first gain mode, the second mixer 820 is disabled. Additionally, in the second gain mode, the voltage step-up circuit 805 and second mixer 820 are enabled and configured to provide a second gain setting for the input signal S_RF to generate the low frequency signal S_LF, and the LNA 810 and first mixer 815 are disabled. The voltage step-up circuit 805 is enabled and employed in both the first and second gain modes. That is, the voltage step-up circuit 805 is shared by both the first mixer 815 and second mixer 820. In this embodiment, the first gain mode is configured as a higher gain mode providing high gain setting for the signal S_RF to achieve lower noise with an acceptable linearity, and the second gain mode is configured as a low gain mode providing lower gain setting for the signal S_RF to achieve a better linearity performance with acceptable noise. The RF receiver front-end 800 can get a good trade-off between noise and linearity performance. In addition, utilizing the voltage step-up circuit 805 can improve the total gain value of receiver front-end 800 by providing a passive voltage gain (i.e. step-up ratio). Both the above-mentioned gain modes share/use the same voltage step-up circuit 805 to provide multiple gain settings for the input signal S_RF.

Figure 9:
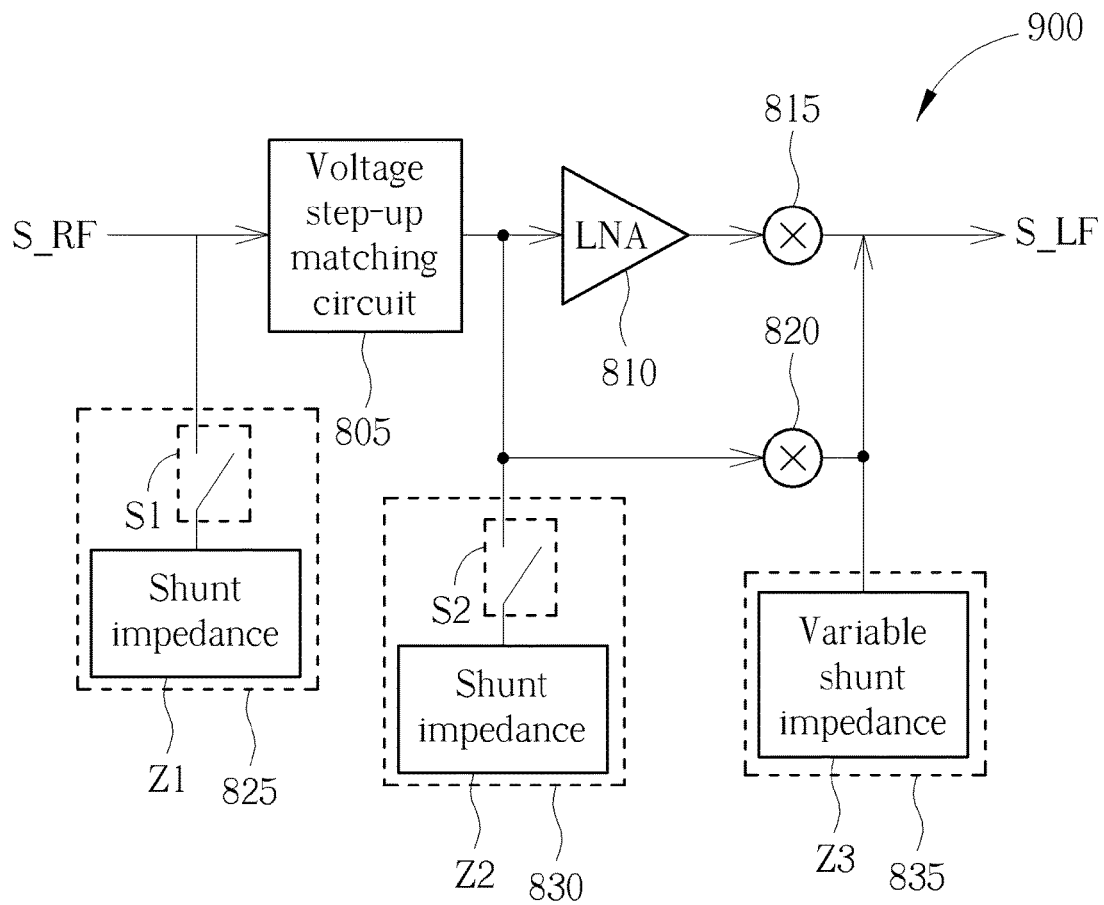
FIG. 9 is a block diagram of a radio frequency receiver front-end according to a fourth embodiment of the invention.

In another embodiment, at least one switchable impedance unit such as a combination of switch and shunt impedance unit can be added to an RF receiver front-end to further generate and provide a different gain setting for the input signal S_RF. FIG. 9 is a block diagram of an RF receiver front-end 900 according to a fourth embodiment of the invention. The receiver front-end 900 includes the capabilities of supporting multiple gain modes to provide gain control for the input signal S_RF and providing better impedance matching with baseband circuit (s) or intermediate frequency circuit (s). In practice, the receiver 900 comprises the voltage step-up circuit 805, the amplifier 810 such as LNA, first mixer 815, second mixer 820, first switchable impedance unit 825, second switchable impedance unit 830, and a variable impedance unit 835. The first switchable impedance unit 825 comprises a switch Si and a shunt impedance unit Z1, and the second switchable impedance unit 830 comprises a switch S2 and a shunt impedance unit Z2. The variable impedance unit 835 comprises a variable/programmable shunt impedance unit Z3.

The receiver 900 can support three different gain modes to provide three different gain settings for the input signal S_RF, and the voltage step-up circuit 810 is employed in all these three gain modes. The three gain modes comprise a high gain mode, a middle gain mode, and a low gain mode. The first mixer 815 is coupled to the output of LNA 810 and is used for generating the low frequency signal S_LF in a high gain mode (this can be regarded as a first gain mode). The second mixer 820 is coupled to the output of voltage step-up circuit 805 and is used for generating the low frequency signal S_LF in middle and low gain modes (a second gain mode and a third gain mode) that are different from the high gain mode. The voltage step-up circuit 805, LNA 810, and first mixer 815 are enabled in the high gain mode and configured to provide a high gain setting for the input signal S_RF to generate the low frequency signal S_LF. In the high gain mode, the second mixer 820 is disabled, and the switches S1 and S2 are open (i.e. disabled) such that the shunt impedance units Z1 and Z2 are disconnected from the voltage step-up circuit 805. Voltage step-up circuit 805 can provide a voltage gain for the input signal S_RF, and thus it is not required to configure/implement the LNA 810 with a higher gain value. In the high gain mode, the receiver 900 is arranged to achieve better/excellent noise figure performance with an acceptable linearity performance; that is, the linearity performance can be secondary. Current consumption of LNA 810 can be reduced since of the operation of Voltage step-up circuit 805 and that it is not required to make the LNA 810 support a higher gain value and a better linearity simultaneously. In addition, the variable shunt impedance unit Z3 of variable impedance unit 835 is used for impedance matching and gain controls for the signal generate at the output of mixer 815 (i.e. the low frequency signal S_LF).

Additionally, in the middle gain mode (second gain mode), the voltage step-up circuit 805 and second mixer 820 are enabled and configured to provide a middle gain setting for the input signal S_RF to generate the low frequency signal S_LF. The LNA 810 and first mixer 815 are disabled, and the switches S1 as well as S2 are open (i.e. disabled). Turning off the LNA 810 in the middle gain mode can reduce current consumption. The Voltage step-up circuit 805 can provide a voltage gain for the input signal S_RF, and consequently the noise figure of the second mixer 820 can be significantly improved. The combination of a voltage step-up circuit and a passive mixer achieves an excellent linearity performance and good noise figure performance. The middle gain mode considers a trade-off between noise figure performance and linearity performance. In addition, the variable shunt impedance unit Z3 of variable impedance unit 835 is used for impedance matching and gain controls for the signal generate at the output of mixer 820 (i.e. the low frequency signal S_LF).

Additionally, in the low gain mode, the voltage step-up circuit 805 and second mixer 820 are enabled, and the switches S1 as well as S2 are closed (i.e. enabled). The LNA 810 and first mixer 815 are disabled. The voltage step-up circuit 805, second mixer 820, and shunt impedance Z2 are used for providing a low gain setting for the input signal S_RF to generate the low frequency signal S_LF. In the low gain mode, the switch S2 is enabled to reduce the voltage gain (i.e. step-up ratio) provided by voltage step-up circuit

805 by shunting the input of second mixer 820 with the shunt impedance unit Z2. In addition, enabling the switch S1 is to compensate the input return loss decreased by connecting the shunt impedance Z2 to the receiver front-end 900. The input return loss can be improved by shunting the input of voltage step-up circuit 805 with the shunt impedance unit Z1. In addition, the variable shunt impedance unit Z3 of variable impedance unit 835 is used for impedance matching and gain controls for the signal generate at the output of mixer 820 (i.e. the low frequency signal S_LF).

Further, in another embodiment, the first switchable impedance unit 825 and variable impedance unit 835 can be excluded from the RF receiver front-end 900. That is, RF receiver front-end 900 can comprise only one switchable impedance unit 830 to provide middle gain setting. The first switchable impedance unit 825 and variable impedance unit 835 are optional.

Figure 10:
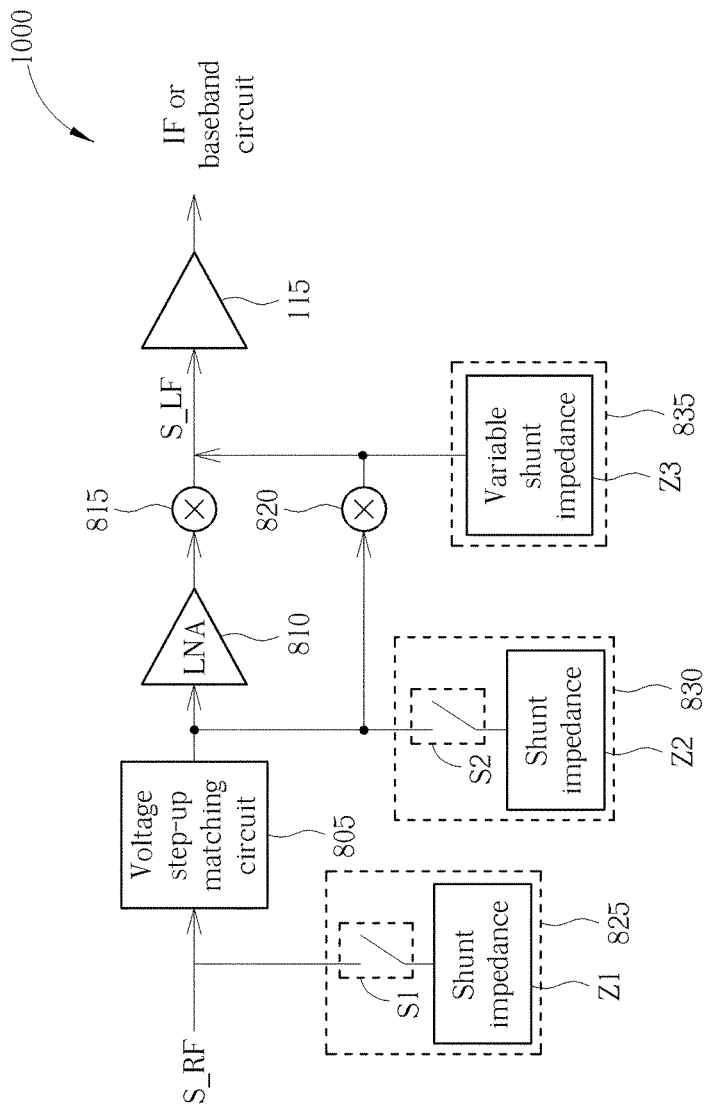
FIG. 10 shows a block diagram of an RF receiver front-end that combines the concepts of receiver front-end of FIG. 1 and receiver front-end of FIG. 9.

It should be appreciated by a skilled person after reading the above descriptions that the voltage step-up circuit 805 may be implemented by using the voltage step-up circuit 605 shown in FIG. 6-FIG. 7 (e.g. implemented by transformer, LC network or balun), the variable impedance unit 835 maybe implemented by the gain control circuit 110 shown in FIG. 1-FIG. 7, and the mixer 820 can be passive mixer. If the mixer 820 is implemented by a passive mixer, the variable impedance unit 835 can also be used to adjust the input return loss of the receiver front-end 900. FIG. 10 shows a block diagram of an RF receiver front-end that combines the concepts of receiver front-end 100 and receiver front-end 900. The receiver front-end 1000 provides impedance matching control and multiple gain modes for gain control while having low power consumption, good input return loss in all gain modes, and good noise figures in both high gain mode and middle gain mode. More specifically, the receiver front-end 1000 uses passive mixer 820 to save current consumption. The voltage step-up circuit 805 shared between all gain modes improves noise figures and reduces power consumption as well. The switchable impedance unit 825 placed at RF input node improves input return loss. The variable impedance unit 835 placed at mixer output node provides impedance matching and additional gain control that ensures the linearity of the amplifier 115. No TIA is required, and the linearity of the receiver chain is maintained with low current consumption. The receiver front-end 1000 is therefore suitable for low-power designs or ultra-low-power designs.

Figure 11:
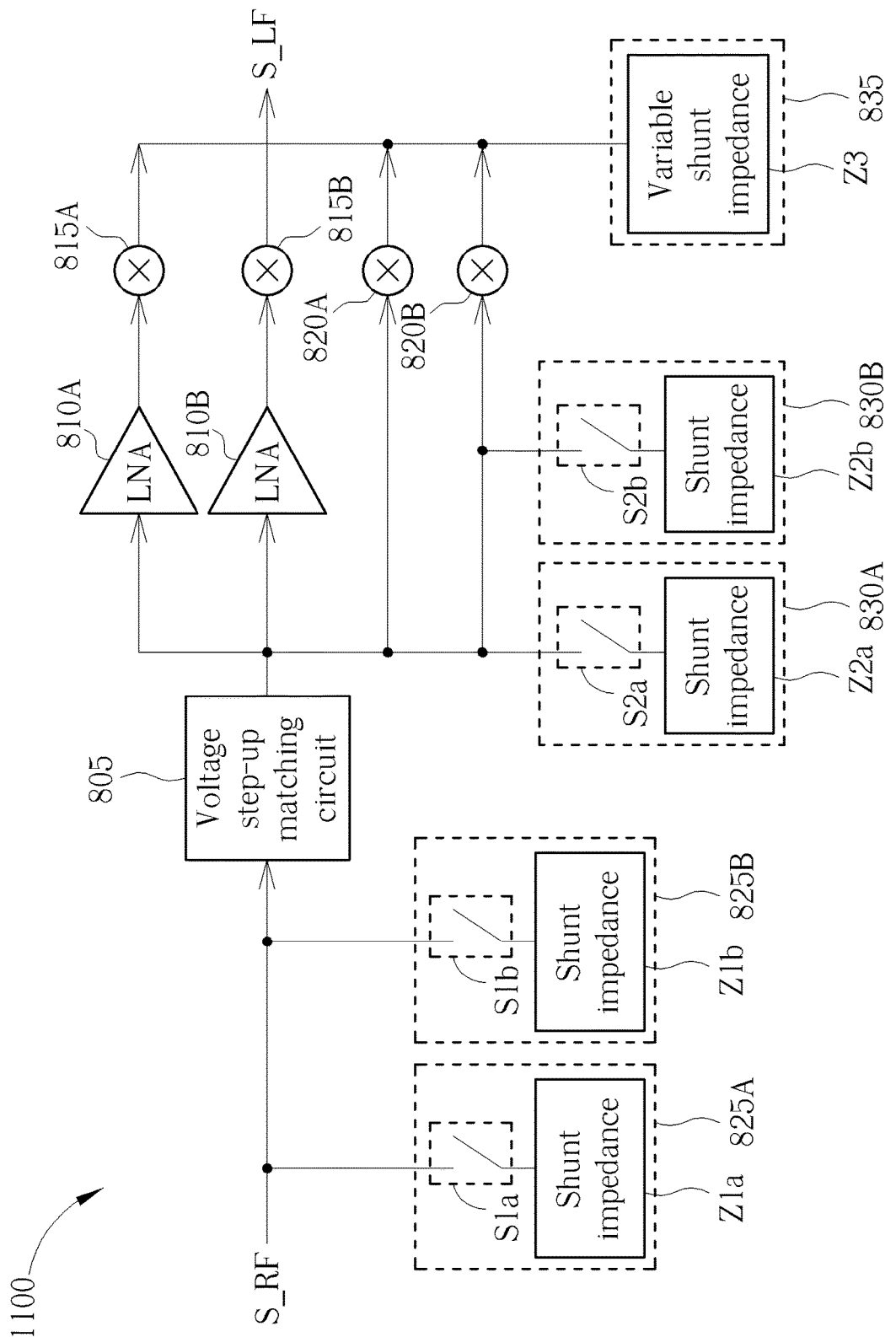
FIG. 11 is a block diagram of a radio frequency receiver front-end according to a fifth embodiment of the invention.

Further, in another embodiment, an RF receiver front-end can be configured to comprise a plurality of first mixers, a plurality of second mixers, a plurality of first switchable impedance units, and a plurality of second switchable impedance units wherein the plurality of first switchable impedance units can be optional (not limited). FIG. 11 is a block diagram of an RF receiver front-end 1100 according to a fifth embodiment of the invention. The receiver front-end 1100 includes capabilities of supporting a variety of gain modes to provide gain control for the input signal S_RF and providing better impedance matching with baseband circuit(s) or intermediate frequency circuit(s). In practice, the receiver front-end 1100 comprises the voltage step-up circuit 805, multiple amplifier 810A-810B such as LNA, multiple first mixers 815A-815B, multiple second mixers 820A-820B, multiple first switchable impedance units 825A-825B, multiple second switchable impedance units 830A-830B, and the variable impedance unit 835. The first switchable impedance units 825A and 825B comprise switches S1a-S1b and shunt impedance units Z1a-Z1b, respectively. The second switchable impedance units 830A-830B comprise switches S2a-S2b and shunt impedance units Z2a-Z2b, respectively. The variable impedance unit 835 comprises the variable/programmable shunt impedance unit Z3. The impedance values of shunt impedance units Z1a-Z1b and shunt impedance units Z2a-Z2b are designed as different (but not limited).

The receiver front-end 1100 can support more than three different gain modes to provide more than three different gain settings for the input signal S_RF, and the voltage step-up circuit 810 is employed in all these gain modes. For each gain mode, only one among mixers 815A-815B and 820A-820B is enabled, and the other mixers are disabled. Each of switches S2a-S2b can be open or closed to connect or disconnect corresponding one of shunt impedance units Z2a-Z2b, respectively, to provide different gain settings in different gain modes. For example, when the second mixer 820A is enabled, the switch S2a (or S2b) can be open or closed to connect or disconnect corresponding shunt impedance unit Z2a (or Z2b) to the mixer 820A, so as to provide different gain settings. For example, in a first gain mode, the signal S_RF passes through the voltage step-up circuit 805, the LNA 810A and the mixer 815A, and the low frequency signal S_LF is generated with a first gain; in a second gain mode, the signal S_RF passes through the voltage step-up circuit 805, the LNA 810B and the mixer 815B, and the low frequency signal S_LF is generated with a second gain; in a third gain mode, the signal S_RF passes through the voltage step-up circuit 805 and the mixer 820A, and the low frequency signal S_LF is generated with a third gain; in a fourth gain setting, the signal S_RF passes through the voltage step-up circuit 805 having the step-up ratio adjusted by the shunt impedance Z2a and the mixer 820A, and the low frequency signal S_LF is generated with a fourth gain; in a fifth gain setting, the signal S_RF passes through the voltage step-up circuit 805 having the step-up ratio adjusted by the shunt impedance Z2b and the mixer 820A, and the low frequency signal S_LF is generated with a fifth gain, and the rest can be deduced by analogy. The above operation is similar to second mixer 820B. Enabling one of the switches S2a-S2b can reduce the voltage gain (i.e. step-up ratio) provided by voltage step-up circuit 805 by shunting the input of second mixer 820 with one shunt impedance unit. In addition, enabling one of the switches S1a-S1b can improve input return loss by shunting the input of voltage step-up circuit 805 with one shunt impedance unit. Further, in another embodiment, the first switchable impedance units 825A-825B and variable impedance unit 835 can be excluded from the RF receiver front-end 1100. That is, RF receiver front-end 1100 can comprise only multiple second switchable impedance units 830A-830B to provide different gain settings. First switchable impedance units and variable impedance unit are optional. Additionally, the numbers of first switchable impedance units and second switchable impedance units are not limited. In other embodiments, more than two first switchable impedance units and more than two second switchable impedance units can be employed to provide more gain settings for the input signal S_RF.

Furthermore, it should be noted that the above-mentioned mixers can be implemented by using single-sideband down-conversion mixers, single-balanced mixers, double-balanced mixers, I/Q down-conversion mixers, image-rejection down-conversion mixers, or any combinations. The type and selection of mixers are not meant to be a limitation of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency (RF) receiver, comprising:
a passive mixer, having an input for receiving a radio frequency signal and an output for generating an output signal at a baseband frequency, the output of the passive mixer being connected to a high impedance circuit;
a gain control circuit, coupled between the output of the passive mixer and an input of an amplifier; and
the amplifier, coupled to the gain control circuit;
wherein the gain control circuit is arranged to detect a signal at the input of the amplifier to adjust a gain value that is exerted on the output signal generated at the output of the passive mixer to maintain linearity of the amplifier.

2. The receiver of claim 1, wherein the gain control circuit comprises:
a passive attenuation circuit, coupled between the output of the passive mixer and the input of the amplifier; and
a detector, coupled to the attenuation circuit and the input of the amplifier, for sensing a level of the signal at the input of the amplifier, and sending a control signal to control the attenuation circuit to adjust the gain level to perform gain attenuation for a level of the output signal generated at the output of the passive mixer.

3. The receiver of claim 2, wherein the detector is arranged to compare the level of the signal at the input of the amplifier with a threshold condition to determine whether to adjust the gain value.

4. The receiver of claim 2, wherein the attenuation circuit comprises a programmable impedance element having one end connected between the passive mixer and the amplifier, the programmable impedance element includes a programmable impedance value Z1.

5. The receiver of claim 2, wherein the attenuation circuit comprises a first programmable impedance element and a second programmable impedance element connected in series; the input of the amplifier is connected between the first and second programmable impedance elements; the first programmable impedance element includes a programmable impedance value Z2, and the second programmable impedance element includes a programmable impedance value Z3, a sum of Z2 and Z3 being constant.

6. The receiver of claim 2, wherein the attenuation circuit comprises:
a multiplexer switch; and
an impedance ladder including a plurality of impedance elements connected in series and including a plurality of nodes which are selectively connected to the multiplexer switch;
wherein the multiplexer switch is arranged to connect the input of the amplifier to one node among the plurality of nodes according to a control of the detector, to provide a gain setting.

7. The receiver of claim 1, further comprising:
a voltage step-up circuit, coupled to the input of the passive mixer, for receiving and providing a voltage gain for the radio frequency signal.

8. An RF receiver, comprising:
a voltage step-up circuit, for receiving and providing a voltage gain for a radio frequency signal;
at least one amplifier, coupled to an output of the voltage step-up circuit;
at least one first mixer, coupled to an output of the at least one amplifier, for generating the low frequency signal in a first gain mode; and
at least one second mixer, coupled to the output of the voltage step-up circuit, for generating the low frequency signal in a gain mode different from the first gain mode;
wherein the voltage step-up circuit, the amplifier, and the at least one first mixer are enabled in the first gain mode to generate the low frequency signal; the voltage step-up circuit and the at least one second mixer are enabled in the gain mode different from the first gain mode to generate the low frequency signal.

9. The receiver of claim 8, further comprising:
a switchable impedance unit, selectively coupled to the output of the voltage step-up circuit;
wherein the voltage step-up circuit and the at least one second mixer are enabled in a second gain mode to generate the low frequency signal while the switchable impedance unit is not coupled to the output of the voltage step-up circuit; and, the voltage step-up circuit, the at least one second mixer, and the switchable impedance unit are enabled in a third gain mode to generate the low frequency signal while the switchable impedance unit is coupled to the output of the voltage step-up circuit; a gain of the second gain mode is higher than a gain of the third gain mode.

10. The receiver of claim 9, wherein the switchable impedance unit comprises a switch and a shunt impedance unit connected in series.

11. The receiver of claim 8, further comprising:
a first switchable impedance unit, selectively coupled to an input of the voltage step-up circuit; and
a second switchable impedance unit, selectively coupled to the output of the voltage step-up circuit;
wherein the first switchable impedance unit is coupled to the input of the voltage step-up circuit when the second switchable impedance unit is coupled to the output of the voltage step-up circuit; the first switchable impedance unit is disconnected from the input of the voltage step-up circuit when the second switchable impedance unit is disconnected from the output of the voltage step-up circuit.

12. The receiver of claim 11, wherein the first switchable impedance unit comprises a switch and a shunt impedance unit connected in series.

13. The receiver of claim 8, further comprising:
a variable/programmable impedance unit, coupled to an output of the at least one first mixer and an output of the at least one second mixer.

14. The receiver of claim 8, wherein the at least one first mixer comprises a plurality of first mixers that correspond to a plurality of amplifiers comprised within the at least one amplifier.

15. The receiver of claim 8, wherein the at least one second mixer comprises a plurality of second mixers.

16. The receiver of claim 8, further comprising:
a plurality of switchable impedance units each being selectively enabled to couple to the output of the voltage step-up circuit to provide a variety of different gain modes for the radio frequency input signal.

17. The receiver of claim 8, further comprising:
a plurality of first switchable impedance units each being selectively enabled to couple to an input of the voltage step-up circuit; and
a plurality of switchable impedance units each being selectively enabled to couple to the output of the voltage step-up circuit to provide a variety of different gain modes for the radio frequency input signal;

wherein a corresponding one of the first switchable impedance units is coupled to the input of the voltage step-up circuit when a corresponding one of the second switchable impedance units is coupled to the output of the voltage step-up circuit; the corresponding one of the first switchable impedance units is disconnected from the input of the voltage step-up circuit when the corresponding one of the second switchable impedance units is disconnected from the output of the voltage step-up circuit.

18. An RF receiver, comprising:

an amplifier, for receiving and providing a signal gain for a radio frequency input signal;

a first mixer, coupled to an output of the amplifier;

a second mixer, coupled to the input of the amplifier; and a switchable impedance unit, selectively coupled to the second mixer;

wherein the amplifier and the first mixer are enabled in the first gain mode to receive the radio frequency input signal and to generate the low frequency signal; the second mixer is enabled and the switchable impedance unit is not coupled to the second mixer in a second gain mode to receive the radio frequency input signal and to generate the low frequency signal; and, the second mixer is enabled and the switchable impedance unit is coupled to the second mixer in a third gain mode to receive the radio frequency input signal and to generate the low frequency signal; the first gain mode, the second gain mode, and the third gain mode respectively correspond to different gain settings.

19. The receiver of claim 18, further comprising:

a variable/programmable impedance unit, coupled to an output of the first mixer and an output of the second mixer.

20. The receiver of claim 18, further comprises:

a plurality of switchable impedance units each being selectively enabled to couple to the second mixer to provide a variety of different gain modes for the radio frequency input signal.

* * * * *